(12) United States Patent
Krishnan et al.

(10) Patent No.: US 7,345,897 B2
(45) Date of Patent: Mar. 18, 2008

(54) ERROR PROTECTED TERNARY CONTENT-ADDRESSABLE MEMORIES AND LOOKUP OPERATIONS PERFORMED THEREON

(75) Inventors: Sriram Chitoor Krishnan, San Jose, CA (US); Rina Panigrahy, Sunnyvale, CA (US); Sunil Parthasarathy, San Jose, CA (US)

(73) Assignee: Cisco Technology, Inc., San Jose, CA (US)

(*) Notice: Subject to any disclaimer, the term of this patent is extended or adjusted under 35 U.S.C. 154(b) by 15 days.

(21) Appl. No.: 11/444,730

(22) Filed: Jun. 1, 2006

(65) Prior Publication Data

US 2007/0086227 A1    Apr. 19, 2007

Related U.S. Application Data

(63) Continuation-in-part of application No. 11/252,960, filed on Oct. 18, 2005.

(51) Int. Cl.
*G11C 15/00* (2006.01)
(52) U.S. Cl. .................. 365/49; 365/205; 711/108; 711/158
(58) Field of Classification Search .......... 365/49, 365/205; 711/108, 158
See application file for complete search history.

(56) References Cited

U.S. PATENT DOCUMENTS

| | | | |
|---|---|---|---|
| 6,181,698 B1 | 1/2001 | Hariguchi | |
| 6,307,798 B1 | 10/2001 | Ahmed et al. | |
| 6,307,855 B1 | 10/2001 | Hariguchi | |
| 6,362,991 B1 | 3/2002 | Barnes | |
| 6,717,946 B1* | 4/2004 | Hariguchi et al. | 370/392 |
| 6,879,504 B1 | 4/2005 | Lien et al. | |
| 7,266,004 B2 | 9/2007 | Krishnan et al. | |
| 2005/0010719 A1 | 1/2005 | Slavin | |
| 2005/0289295 A1 | 12/2005 | Shoham et al. | |
| 2006/0080498 A1* | 4/2006 | Shoham et al. | 711/108 |
| 2006/0168494 A1 | 7/2006 | Trainin | |

OTHER PUBLICATIONS

Jien-Chung Lo, "Fault-Tolerant Content Addressable Memory", pp. 193-196, IEEE, 1993.
Tsiatouhas et al., "A hierarchical architecture for concurrent soft error detection based on current sensing," Proceedings of the Eighth IEEE International On-Line Testing Workshop, pp. 56-60, 2002.
U.S. Appl. No. 10/813,210, filed Mar. 29, 2004, Nagaraj.
U.S. Appl. No. 10/879,254, filed Jun. 29, 2004, Shoham et al.
U.S. Appl. No. 11/040,678, filed Jan. 22, 2005, Trainin.
U.S. Appl. No. 11/280,792, filed Nov. 16, 2005, Shoham et al.
U.S. Appl. No. 11/498,609, filed Aug. 02, 2006, Parthasarathy et al.

* cited by examiner

*Primary Examiner*—Connie C. Yoha
(74) *Attorney, Agent, or Firm*—The Law Office of Kirk D. Williams

(57) ABSTRACT

Ternary content-addressable memory (TCAM) entries are disclosed for use in performing error-protected lookup operations by allowing an error budget of u deviations in values stored in each entry. Each TCAM entry is configured to identify a hit condition (else a miss condition) with an input lookup word if its stored value matches each bit of the lookup word with the exception of zero to u of its cells not matching. This determination may be made, for example, using discrete logic or based a voltage level of one or more match lines. Furthermore, it is possible to store at least $2u+1$ copies of a data value desired to be protected in a such a TCAM entry among its said t TCAM cells.

20 Claims, 10 Drawing Sheets

ERROR PROTECTED TERNARY CONTENT-ADDRESSABLE MEMORIES AND LOOKUP OPERATIONS PERFORMED THEREON

CROSS-REFERENCE TO RELATED APPLICATIONS

This is a continuation-in-part of nonprovisional application Ser. No. 11/252,960, filed Oct. 18, 2005, which is hereby incorporated by reference in its entirety.

TECHNICAL FIELD

One embodiment of the invention relates to communications and computer systems, especially reliable content-addressable memory devices and use thereof; and more particularly, one embodiment relates to programming and identifying entries in a ternary content-addressable memory that differ from a lookup word in less than a predetermined number of bit positions.

BACKGROUND

The communications industry is rapidly changing to adjust to emerging technologies and ever increasing customer demand. This customer demand for new applications and increased performance of existing applications is driving communications network and system providers to employ networks and systems having greater speed and capacity (e.g., greater bandwidth). In trying to achieve these goals, a common approach taken by many communications providers is to use packet switching technology. Increasingly, public and private communications networks are being built and expanded using various packet technologies, such as Internet Protocol (IP). Note, nothing described or referenced in this document is admitted as prior art to this application unless explicitly so stated.

A network device, such as a switch or router, typically receives, processes, and forwards or discards a packet based on one or more criteria, including the type of protocol used by the packet, addresses of the packet (e.g., source, destination, group), and type or quality of service requested. Additionally, one or more security operations are typically performed on each packet. But before these operations can be performed, a packet classification operation must typically be performed on the packet.

Packet classification as required for, inter alia, access control lists (ACLs) and forwarding decisions, is a demanding part of switch and router design. The packet classification of a received packet is increasingly becoming more difficult due to ever increasing packet rates and number of packet classifications. For example, ACLs require matching packets on a subset of fields of the packet flow label, with the semantics of a sequential search through the ACL rules. IP forwarding requires a longest prefix match.

Known approaches of packet classification include using custom application-specific integrated circuits (ASICs), custom circuitry, software or firmware controlled processors, and associative memories, including, but not limited to binary content-addressable memories (binary CAMs) and ternary content-addressable memories (ternary CAMs or TCAMs). Each entry of a binary CAM typically includes a value for matching against, while each TCAM entry typically includes a value and a mask. The associative memory compares a lookup word against all of the entries in parallel, and typically generates an indication of the highest priority entry that matches the lookup word. An entry matches the lookup word in a binary CAM if the lookup word and the entry value are identical, while an entry matches the lookup word in a TCAM if the lookup word and the entry value are identical in the bits that are not indicated by the mask as being irrelevant to the comparison operations.

FIGS. 1A-B illustrate one implementation of a prior art binary content-addressable memory entry 100 and bit cells 101A-B therein. Each bit cell 101A-B includes a storage 105A-B for storing a value to be matched against, which are stored by exerting the read/write line 110 and based on the bit values and their complements on lines 111A-B and 112A-B. In order to determine if binary content-addressable memory entry 100 matches a lookup word, match line 132 is precharged to Vdd based on precharging signal 120 during a precharging phase of the lookup operation. The bit values (and their complements) of the lookup word are applied on bit lines 111A-B and 112A-B, which are compared by comparison circuits 130 during a matching phase of the lookup operation to the stored bit values (105A-B). If any of the entry bit cells 101A-B determine that they do not match, then match line 132 is discharged by the corresponding comparison circuit(s) 130.

This is shown in more depth in FIG. 1B by binary CAM cell 140 with discharge paths 141. The particular one of the two discharge paths 141 that will discharge match line 132 in response to an input bit value not matching the stored value depends on the stored value to be matched, the input bit's lookup value, and the implementation of the binary CAM cell.

Any drop in the voltage of match line 132 is amplified, with any slight change in the voltage of match line 132 quickly detected by match line sense amplifier 135, which provides the corresponding hit/miss indication 136 based on the results of the comparison operations.

FIGS. 1C-D illustrate one implementation of a prior art ternary content-addressable memory entry 150 and bit cells 151A-B therein. The operation of ternary CAM entry 150 is very similar to that of binary CAM entry (FIG. 1A). Each TCAM cell 151A-B stores a value to be matched against, with this value representing one of the three values: one, zero and don't care/wild card (i.e., match either one or zero). Therefore, a two-bit storage 155A-B is typically used in TCAM cells 151A-B to store its value. Any drop in the voltage of match line 182 caused by comparison circuits 180 is amplified, with any slight change in the voltage of match line 182 quickly detected by match line sense amplifier 185, which provides the corresponding hit/miss indication 186 based on the results of the comparison operations.

For example, in a TCAM cell, a stored value of one might be encoded as bits '10', a zero might be encoded as bits '01', and don't care (often represented as '*') might be encoded as bits '00'. The encoding of the bits to be matched are supplied via data lines 161A-B and 162A-B. With this encoding scheme for storing the values in TCAM cells 151A-B and the NMOS implementation shown in more detail in FIG. 1D, an encoding of the lookup value of one or zero for each TCAM cell is just such that if the supplied lookup bit value does not match the TCAM cell 190, then one of the two discharge paths 191 will be turned on to pull down match line 182. For example, with a stored value of one ('10'), a supplied lookup value of zero ('10') is provided such that two transistors will be enabled to form one of the discharge paths 191, causing match line 182 to drop. This voltage drop is detected by match line sense amplifier 185 and a miss signal 186 generated to signal that the stored value in the TCAM entry does not match the lookup word.

Note, if the encoding of a don't care value is '00' and each bit is applied to a transistor in a different discharge path, then a discharge path will never become active, and therefore, the TCAM cell will effectively match the value of the corresponding bit of the lookup word.

Associative memories are very useful in performing packet classification operations. As with most any system, errors can occur. For example, array parity errors can occur in certain content-addressable memories as a result of failure-in-time errors which are typical of semiconductor devices.

When a packet classification lookup operation is performed on an associative memory with corrupted entries, a bit error in an entry can result in a false hit, or a false miss. A false hit occurs when the corrupted value of an entry matches the lookup value when it otherwise would not match that entry (and thus another entry or no entry should have been matched). A false miss occurs when an entry should have been matched except for the corruption in the entry. This could result in no entry being matched or another lower-priority entry being matched. When these lookup operations are used for packet classification, an incorrect match or miss presents a problem especially when identifying a route or performing a security classification.

Error-correcting and error-detecting codes are well-known. For example, ANDREW S. TANENBAUM, COMPUTER NETWORKS, Prentice-Hall, 1981, pp. 125-132, discusses error-correcting and error-detecting codes, and is hereby incorporated by reference. Assume a codeword contains n bits of which m are data bits and r are error-correcting or error-detecting bits (e.g., redundant or check bits), with n=m+r. There are many well-known ways to generate the error-detecting and error-correcting bits. Given two codewords, it is possible to determine how many bits differ (e.g., by exclusively-OR'ing or one bit summing the corresponding bits of the two codewords and summing these results). The number of bit positions in which two codewords or a set of codewords differ is called the Hamming distance. A Hamming distance of d, means that it will require d single-bit errors to convert one codeword to another codeword. To detect j errors, a Hamming distance of j+1 is required because with such a code, there is no way that j single-bit errors can change a valid codeword into another valid codeword. Similarly, to correct j errors, a distance 2j+1 code because that way the legal codewords are so far apart that even with j changes, the original codeword is still closer than any other codeword, so it can be uniquely determined.

A prior approach protects the associative memory entries with error detection or correction values when the associative memory is not being used to perform a lookup operation. For example, using a background operation, the associative memory entries are periodically checked and corrected for errors (e.g., read from their location and if an error, the correct value is written back). Another prior approach is to periodically over write each associative memory entry with the correct value. These and other prior approaches do not immediately detect the error, nor detect the error when a lookup operation is performed on the corrupted entry. Thus, there can be significant periods (e.g., several seconds to minutes which can be a very long time in the context of a packet switch) before such corrupted entry is corrected.

Some random access memory (RAM) add error-correcting or error-detecting codes to each memory cell. As part of a read operation of a memory location, the data portion and the error-correcting or error-detecting code is read, which is then used to detect a possible error and/or correct a discovered error in the data portion. This is especially convenient to do as only one set of error-detecting/error correcting circuitry is required (i.e., to operate on the data read from the specified memory location). However, this approach is impractical for an associative memory, as each associative memory entry would need this complete circuitry, and the result of the error-corrected operation for each memory location would need to be compared to the lookup word for every lookup operation.

Shoham et al., "Error Protection for Lookup Operations in Content-Addressable Memory Entries," U.S. patent application Ser. No. 10/879,254, filed Jun. 29, 2004, is hereby incorporated by reference in its entirety. Shoham et al. discloses techniques for populating content-addressable memory entries with values that have a Hamming distance of n bits and for identifying a matching entry that matches in at least k bit positions, where n>k>0. Other techniques not explicitly disclosed in Shoham et al. for identifying such matching entries could be useful.

SUMMARY

Disclosed are, inter alia, methods, apparatus, data structures, computer-readable media, mechanisms, and means for identifying entries in a content-addressable memory that differ from a lookup word in less than a predetermined number of bit positions.

One embodiment is configured to identify matching values differing in less than a predetermined number of ternary content-addressable memory (TCAM) cells. A TCAM entry includes t TCAM entry cells, with each particular TCAM entry cell of the TCAM entry cells being configured to identify whether or not a bit value of a lookup word in a bit position in the lookup word corresponding to the particular TCAM cell matches the particular TCAM entry cell's predetermined value of a set of values including: one, zero and don't care. A match line, coupled to each of the TCAM entry cells, is configured to provide a match reference voltage after the match line is precharged during a precharge phase prior to a matching phase of a lookup operation on the lookup word. The match line is responsive to the identifications of not matching by the TCAM cells, such that the match reference voltage falls at rate corresponding to the number of active discharge paths in the TCAM entry cells that do not match for the lookup word. A comparator, coupled to the match line, is configured to identify whether or not the match reference voltage is above or below a predetermined voltage level selected to reflect a matching of the lookup word by at least t-u TCAM cells at a predetermined time of the lookup operation. The predetermined voltage level is selected such that the match reference voltage will be above the predetermined voltage level at the predetermined time if u or less of the TCAM cells identified as not matching and the match reference voltage will be below the predetermined voltage level at the predetermined time if at least u+1 TCAM cells identified as not matching; wherein t>u>0.

One embodiment performs error protected lookup operations on a data value in a ternary content-addressable memory (TCAM) entry. The TCAM entry includes t TCAM cells, and the data value includes a plurality of data bit values from a set of data bit values including one, zero, and don't care. At least 2u+1 copies of the data value are stored among the t TCAM cells. The lookup word is applied to the t TCAM cells. A determination is made as to whether or not at least all but u of the TCAM cells match their respective bit position in the lookup word. A hit/miss indication of whether or not at least all but u of the TCAM cells match their respective bit position in the lookup word is generated. In one embodiment, t>u>0. In one embodiment, this determination is performed using discrete logic. In one embodiment, this determination is made based on a voltage level of one or more match lines.

BRIEF DESCRIPTION OF THE DRAWINGS

The appended claims set forth the features of the invention with particularity. The invention, together with its advantages, may be best understood from the following detailed description taken in conjunction with the accompanying drawings of which:

DETAILED DESCRIPTION

Figure 1A:
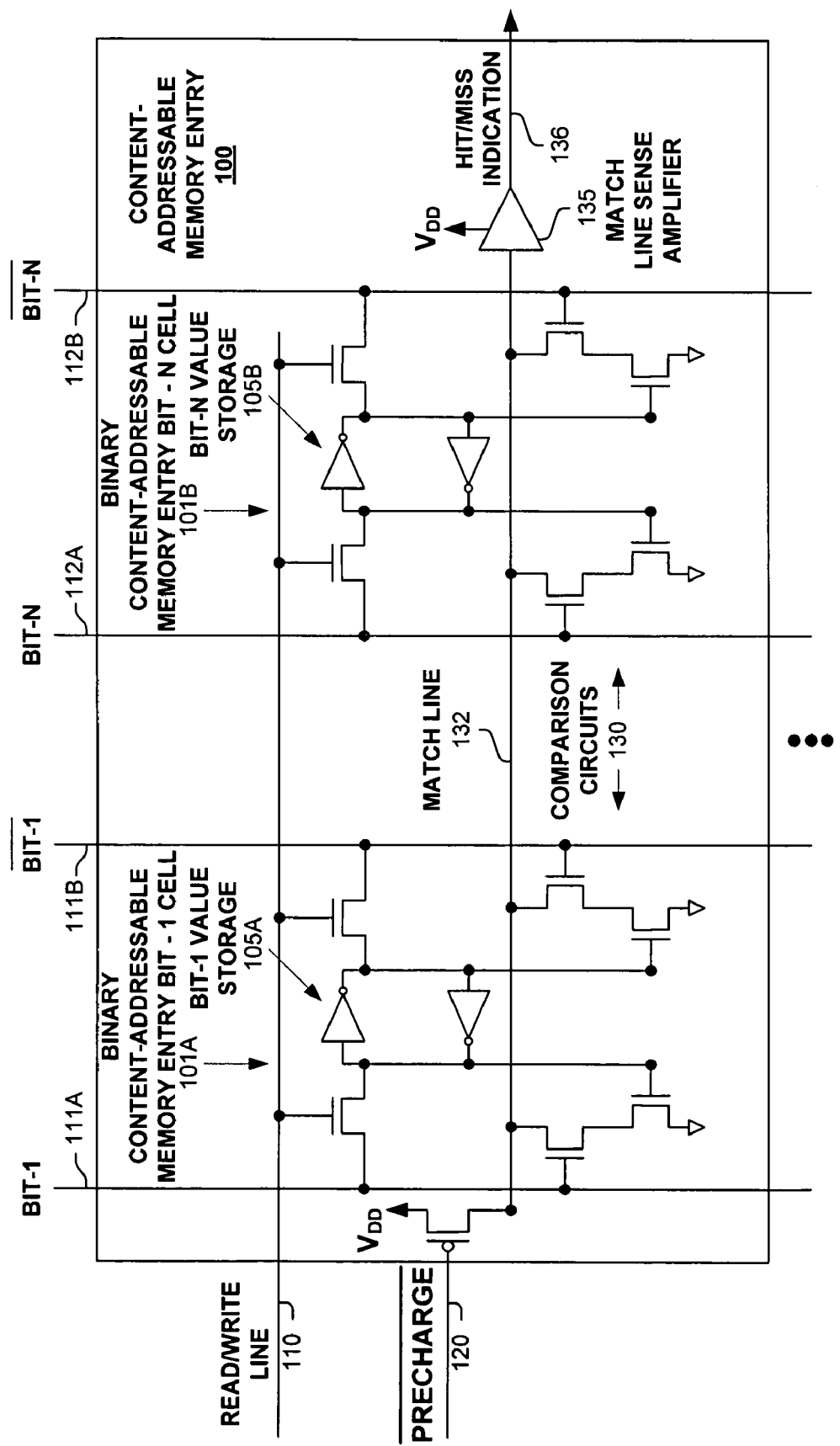
FIGS. 1A-D are a block diagram of a prior art content-addressable memory entry and bit cells therein.
Figure 1B:
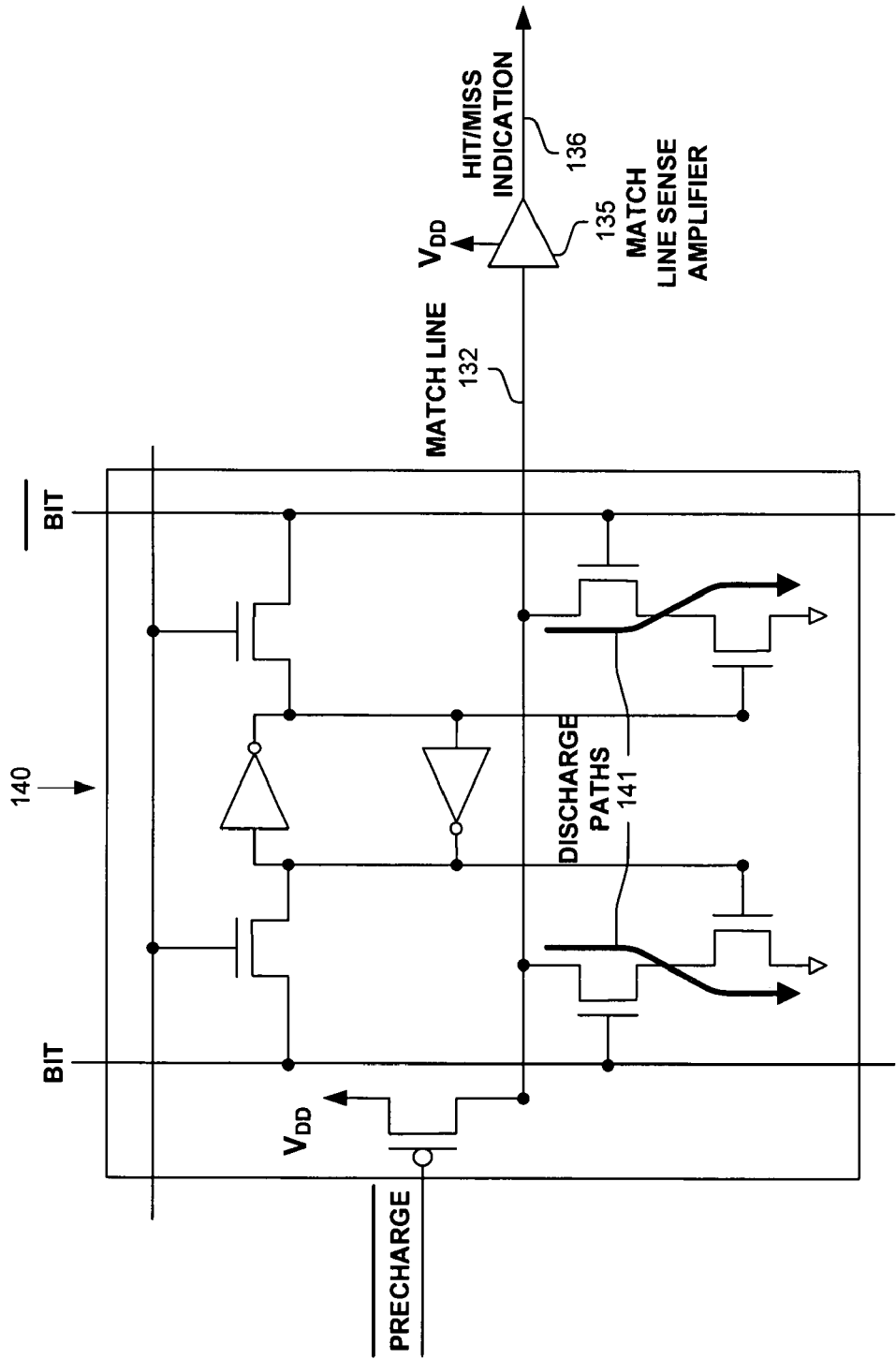
Figure 1C:
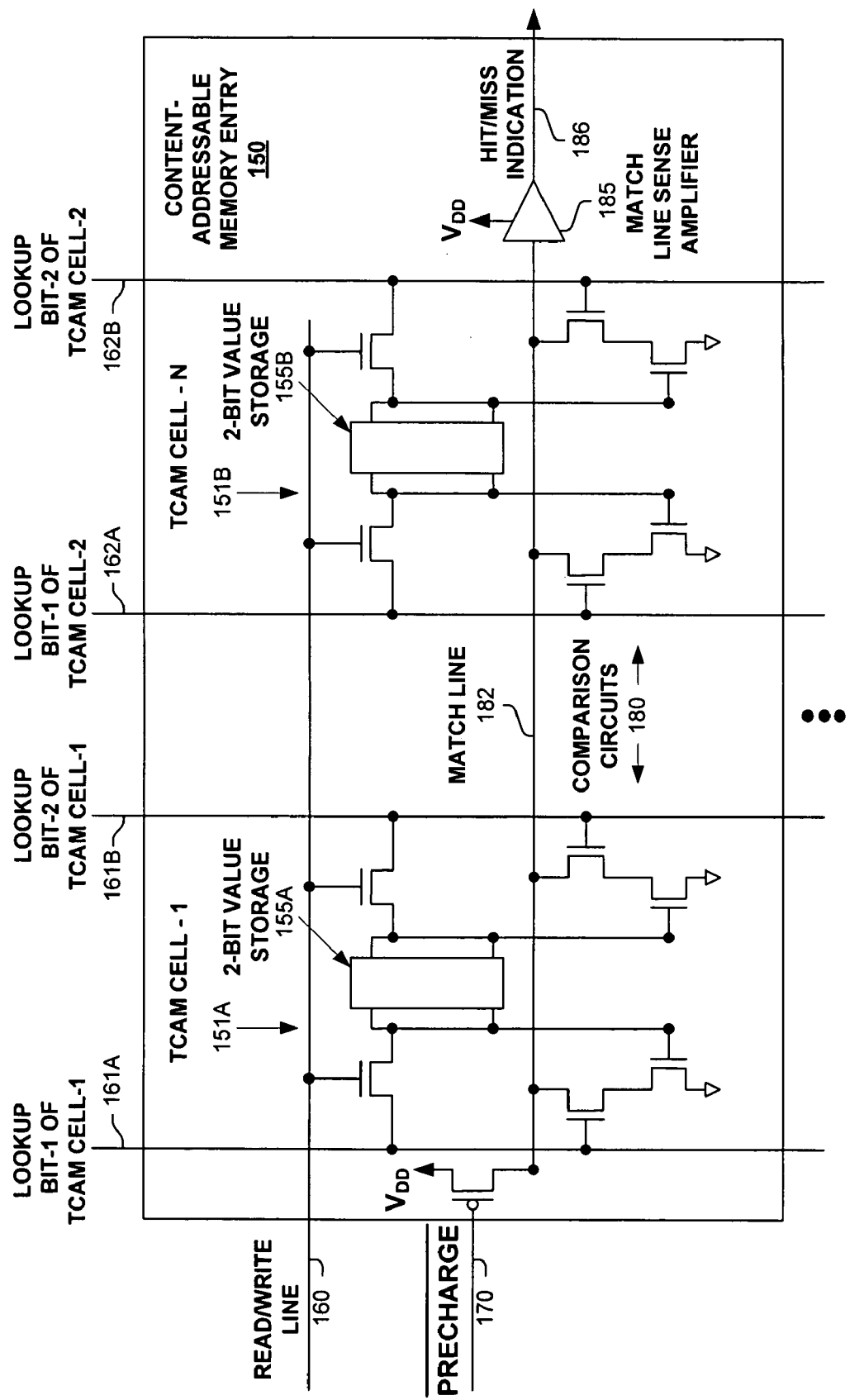
Figure 1D:
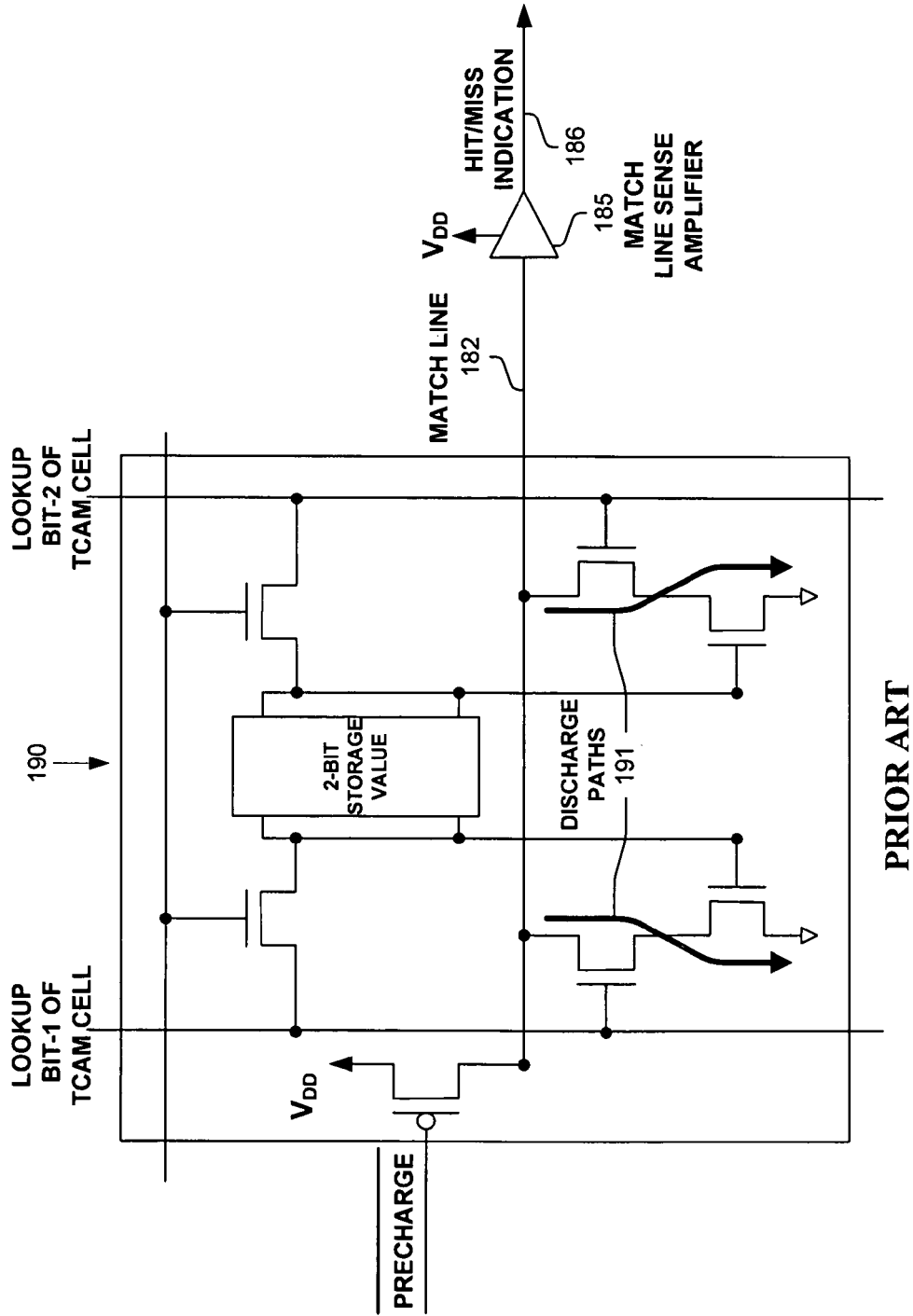

Disclosed are, inter alia, methods, apparatus, data structures, computer-readable media, mechanisms, and means for identifying entries in a content-addressable memory that differ from a lookup word in less than a predetermined number of bit positions.

Note, embodiments described herein include various elements and limitations, with no one element or limitation contemplated as being a critical element or limitation. Each of the claims individually recites an aspect of the invention in its entirety. Moreover, some embodiments described may include, but are not limited to, inter alia, systems, networks, integrated circuit chips, embedded processors, ASICs, methods, and computer-readable media containing instructions. One or multiple systems, devices, components, etc. may comprise one or more embodiments, which may include some elements or limitations of a claim being performed by the same or different systems, devices, components, etc. The embodiments described hereinafter embody various aspects and configurations within the scope and spirit of the invention, with the figures illustrating exemplary and non-limiting configurations. Note, computer-readable media and means for performing methods and processing block operations are disclosed and are in keeping with the extensible scope and spirit of the invention.

As used herein, the term "packet" refers to packets of all types or any other units of information or data, including, but not limited to, fixed length cells and variable length packets, each of which may or may not be divisible into smaller packets or cells. The term "packet" as used herein also refers to both the packet itself or a packet indication, such as, but not limited to all or part of a packet or packet header, a data structure value, pointer or index, or any other part or direct or indirect identification of a packet or information associated therewith. For example, often times a router operates on one or more fields of a packet, especially the header, so the body of the packet is often stored in a separate memory while the packet header is manipulated, and based on the results of the processing of the packet (i.e., the packet header in this example), the entire packet is forwarded or dropped, etc. Additionally, these packets may contain one or more types of information, including, but not limited to, voice, data, video, and audio information. The term "item" is used generically herein to refer to a packet or any other unit or piece of information or data, a device, component, element, or any other entity. The phrases "processing a packet" and "packet processing" typically refer to performing some steps or actions based on the packet contents (e.g., packet header or other fields), and such steps or action may or may not include modifying, storing, dropping, and/or forwarding the packet and/or associated data.

The term "system" is used generically herein to describe any number of components, elements, sub-systems, devices, packet switch elements, packet switches, routers, networks, computer and/or communication devices or mechanisms, or combinations of components thereof. The term "computer" is used generically herein to describe any number of computers, including, but not limited to personal computers, embedded processing elements and systems, control logic, ASICs, chips, workstations, mainframes, etc. The term "processing element" is used generically herein to describe any type of processing mechanism or device, such as a processor, ASIC, field programmable gate array, computer, etc. The term "device" is used generically herein to describe any type of mechanism, including a computer or system or component thereof. The terms "task" and "process" are used generically herein to describe any type of running program, including, but not limited to a computer process, task, thread, executing application, operating system, user process, device driver, native code, machine or other language, etc., and can be interactive and/or non-interactive, executing locally and/or remotely, executing in foreground and/or background, executing in the user and/or operating system address spaces, a routine of a library and/or standalone application, and is not limited to any particular memory partitioning technique. The steps, connections, and processing of signals and information illustrated in the figures, including, but not limited to any block and flow diagrams and message sequence charts, may typically be performed in the same or in a different serial or parallel ordering and/or by different components and/or processes, threads, etc., and/or over different connections and be combined with other functions in other embodiments, unless this disables the embodiment or a sequence is explicitly or implicitly required (e.g., for a sequence of read the value, process the value the value must be obtained prior to processing it, although some of the associated processing may be performed prior to, concurrently with, and/or after the read operation). Furthermore, the term "identify" is used generically to describe any manner or mechanism for directly or indirectly ascertaining something, which may include, but is not limited to receiving, retrieving from memory, determining, defining, calculating, generating, etc.

Moreover, the terms "network" and "communications mechanism" are used generically herein to describe one or more networks, communications media or communications systems, including, but not limited to the Internet, private or public telephone, cellular, wireless, satellite, cable, local area, metropolitan area and/or wide area networks, a cable, electrical connection, bus, etc., and internal communications mechanisms such as message passing, interprocess communications, shared memory, etc. The term "message" is used generically herein to describe a piece of information which may or may not be, but is typically communicated via one or more communication mechanisms of any type.

The term "storage mechanism" includes any type of memory, storage device or other mechanism for maintaining instructions or data in any format. "Computer-readable medium" is an extensible term including any memory, storage device, storage mechanism, and other storage mechanisms. The term "memory" includes any random access memory (RAM), read only memory (ROM), flash memory, integrated circuits, and/or other memory components or elements. The term "storage device" includes any solid state storage media, disk drives, diskettes, networked services, tape drives, and other storage devices. Memories and storage devices may store computer-executable instructions to be executed by a processing element and/or control logic, and data which is manipulated by a processing element and/or control logic. The term "data structure" is an extensible term referring to any data element, variable, data structure, database, and/or one or more organizational schemes that can be applied to data to facilitate interpreting the data or performing operations on it, such as, but not limited to memory locations or devices, sets, queues, trees, heaps, lists, linked lists, arrays, tables, pointers, etc. A data structure is typically maintained in a storage mechanism. The terms "pointer" and "link" are used generically herein to identify some mechanism for referencing or identifying another element, component, or other entity, and these may include, but are not limited to a reference to a memory or other storage mechanism or location therein, an index in a data structure, a value, etc.

The term "one embodiment" is used herein to reference a particular embodiment, wherein each reference to "one embodiment" may refer to a different embodiment, and the use of the term repeatedly herein in describing associated features, elements and/or limitations does not establish a cumulative set of associated features, elements and/or limitations that each and every embodiment must include, although an embodiment typically may include all these features, elements and/or limitations. In addition, the phrase "means for xxx" typically includes computer-readable medium containing computer-executable instructions for performing xxx.

In addition, the terms "first," "second," etc. are typically used herein to denote different units (e.g., a first element, a second element). The use of these terms herein does not necessarily connote an ordering such as one unit or event occurring or coming before another, but rather provides a mechanism to distinguish between particular units. Additionally, the use of a singular tense of a noun is non-limiting, with its use typically including one or more of the particular thing rather than just one (e.g., the use of the word "memory" typically refers to one or more memories without having to specify "memory or memories," or "one or more memories" or "at least one memory", etc.). Moreover, the phrases "based on x" and "in response to x" are used to indicate a minimum set of items x from which something is derived or caused, wherein "x" is extensible and does not necessarily describe a complete list of items on which the operation is performed, etc. Additionally, the phrase "coupled to" is used to indicate some level of direct or indirect connection between two elements or devices, with the coupling device or devices modifying or not modifying the coupled signal or communicated information. The term "subset" is used to indicate a group of all or less than all of the elements of a set. The term "subtree" is used to indicate all or less than all of a tree. Moreover, the term "or" is used herein to identify a selection of one or more, including all, of the conjunctive items.

Disclosed are, inter alia, methods, apparatus, data structures, computer-readable media, mechanisms, and means for identifying entries in a content-addressable memory that differ from a lookup word in less than a predetermined number of bit positions. Note, the embodiments disclosed herein can be used to provide a reliable lookup mechanism allowing for a small number of transient bit errors, wherein each of the original stored associative memory entries differ in more bit positions than the maximum number of bit position misses that which will still allow the associative memory entry to be identified as matching the lookup word, such as that disclosed in Shoham et al., "Error Protection for Lookup Operations in Content-Addressable Memory Entries," U.S. patent application Ser. No. 10/879,254, filed Jun. 29, 2004, and hereby incorporated by reference in its entirety. Of course, embodiments of the invention disclosed herein can also be used in other applications.

One embodiment for identifying matching values differing in less than a predetermined number of bit positions includes: a content-addressable memory entry including n content-addressable memory entry cells, a match line, and a comparator. Each particular content-addressable memory entry cell is configured to identify whether or not a bit value of a lookup word in a corresponding bit position in the lookup word matches the particular content-addressable memory entry cell's predetermined bit value. The match line is configured to be precharged during a precharge phase prior to a matching phase of a lookup operation on the lookup word, and then to provide a match reference voltage responsive to the identifications of not matching by the content-addressable memory cells, such that the match reference voltage falls at rate corresponding to the number of content-addressable memory entry cells identifying it is not matched. The comparator is configured to identify whether or not the match reference voltage is above or below a predetermined voltage level selected to reflect a matching of the lookup word by at least m of the content-addressable memory cells at a predetermined time of the lookup operation, wherein the match reference voltage is selected such that it will be above the predetermined voltage level at the predetermined time if at least m of the content-addressable memory cells did not identify themselves as not matching and the match reference voltage will be below the predetermined voltage level at the predetermined time if at least n−m+1 of the content-addressable memory cells did identify themselves as not matching; wherein n>m>0. In one embodiment, the predetermined voltage level is static for the content-addressable memory entry (e.g., manufactured at a voltage level, a constant voltage level received from an external source, etc.). In one embodiment, the predetermined voltage level is dynamic to adjust for different values of m, such as, but not limited to a received voltage level of possibly different voltage levels, a selectable voltage level from different voltages levels, etc. One embodiment includes a data latching mechanism coupled to the comparator for latching the identification of whether or not the match reference voltage is above or below a predetermined voltage level at the predetermined time.

One embodiment for identifying matching values differing in less than a predetermined number of bit positions includes multiple content-addressable memory entries configured to identify whether or not they match a lookup word and a priority encoder configured to identify a highest priority matching entry from the entries indicating that it matched, if any. Each of the content-addressable memory entries includes: n content-addressable memory entry cells, a match line, and a comparator. Each particular content-addressable memory entry cell is configured to identify whether or not a bit value of a lookup word in a corresponding bit position in the lookup word matches the particular content-addressable memory entry cell's predetermined bit value. The match line is configured to be precharged during a precharge phase prior to a matching phase of a lookup operation on the lookup word, and then to provide a match reference voltage responsive to the identifications of not matching by the content-addressable memory cells, such that the match reference voltage falls at rate corresponding to the number of content-addressable memory entry cells identifying it is not matched. The comparator is configured to identify whether or not the match reference voltage is above or below a predetermined voltage level selected to reflect a matching of the lookup word by at least m content-addressable memory cells at a predetermined time of the lookup operation, wherein the match reference voltage is selected such that it will be above the predetermined voltage level at the predetermined time if at least m of the content-addressable memory cells did not identify themselves as not matching and the match reference voltage will be below the predetermined voltage level at the predetermined time if at least n−m+1 of the content-addressable memory cells did identify themselves as not matching; wherein n>m>0. In one embodiment, each of the content addressable memory entries includes a predetermined voltage level mechanism for generating a static voltage level for the predetermined voltage level. In one embodiment, each of the content addressable memory entries includes a predetermined voltage level mechanism for dynamically defining the predetermined voltage level corresponding to m. In one embodiment, each of the content-addressable memory entries includes a data latching mechanism coupled to the comparator for latching the identification of whether or not the match reference voltage is above or below a predetermined voltage level at the predetermined time.

One embodiment for identifying matching values differing in less than a predetermined number of bit positions, includes: a content-addressable memory entry including n content-addressable memory entry cells, each particular content-addressable memory entry cell being configured to identify whether or not a corresponding bit value of a lookup word in matches the particular content-addressable memory entry cell's predetermined bit value; means for providing a match reference voltage reflective of the number of the identifications by the content-addressable memory cells of whether or not they matched, with the match reference voltage varying during a matching phase of a lookup operation on the lookup word at a rate said reflective of the number of the identifications by the content-addressable memory cells of whether or not they matched; and means for identifying whether or not the match reference voltage reflects a match of at least m said content-addressable memory cells and not a match of less than m said content-addressable memory cells at a predetermined time during the matching phase; wherein n>m>0. One embodiment includes means for providing a predetermined voltage level for comparing with the match reference voltage level. In one embodiment, means for providing the predetermined voltage level includes circuitry for providing a static voltage level corresponding to m. In one embodiment, means for providing the predetermined voltage level includes circuitry for receiving a voltage level from an external source, with this voltage level being used directly or after adjustment as the predetermined voltage level. In one embodiment, means for providing the predetermined voltage level includes circuitry for selecting among different predetermined voltage levels corresponding to different values of m. In one embodiment, means for providing the predetermined voltage level includes circuitry for producing or generating different predetermined voltage levels corresponding to different values of m. One embodiment includes a data latching mechanism coupled to the comparator for latching said identification of whether or not the match reference voltage is above or below a predetermined voltage level at the predetermined time.

One embodiment for identifying matching values differing in less than a predetermined number of bit positions: precharges a match line coupled to each of n content-addressable memory cells of a content-addressable memory entry in preparation for performing a lookup operation based on a lookup word; determines whether or not each of the content-addressable memory cells matches a bit value at a corresponding bit position in the lookup word, with each of said content-addressable memory cells that determined that it does not match providing a discharge path for the precharged match line causing a match reference voltage of the match line to vary during the lookup operation at a rate reflective of the number of content-addressable memory cells that determined that it does not match; and identifies whether or not the match reference voltage reflects a match of at least m said content-addressable memory cells and not a match of less than m said content-addressable memory cells at a predetermined time during the lookup operation; wherein n>m>0. One embodiment, in identifying whether or not the match reference voltage reflects a match of at least m said content-addressable memory cells and not a match of less than m said content-addressable memory cells at the predetermined time during the lookup operation, includes comparing the match reference voltage to a predetermined voltage level and identifying a match if the match reference voltage is greater than the predetermined voltage level and identifying no match if the match reference voltage is less than the predetermined voltage level. One embodiment includes generating a predetermined voltage level based on the value of m; and wherein identifying whether or not the match reference voltage reflects a match includes comparing the match reference voltage with the predetermined voltage level. One embodiment latches the identification of whether or not the match reference voltage reflects a match of at least m said content-addressable memory cells and not a match of less than m said content-addressable memory cells at the predetermined time during the lookup operation.

One embodiment for identifying matching values differing in less than a predetermined number of bit positions, includes: means for precharging a match line of each of n content-addressable memory cells of a content-addressable memory entry in preparation of performing a lookup operation based on a lookup word; means for determining whether or not each of said content-addressable memory cells matches a bit value at a corresponding bit position in the lookup word, with each of the content-addressable memory cells determining that it does not match providing a discharge path for the match line previously precharged for performing the lookup operation on the lookup word causing a match reference voltage of the match line to vary during the lookup operation at a rate reflective of the number of said content-addressable memory cells that determined that it does not match; and means for identifying whether or not the match reference voltage reflects a match of at least m said content-addressable memory cells and not a match of less than m said content-addressable memory cells at a predetermined time during the lookup operation; wherein n>m>0. One embodiment includes means for generating a predetermined voltage level based on the value of m; wherein said means for identifying whether or not the match reference voltage reflects a match includes means for comparing the match reference voltage with the predetermined voltage level.

In one embodiment, n−m+1 equals two. In one embodiment, n−m+1 is more than two. In one embodiment, the bit value consists of two possible states corresponding to a zero and a one (such as in a binary content-addressable memory). In one embodiment, the bit value consists of three possible states corresponding to a zero, a one, and don't care (such as in a ternary content-addressable memory).

One embodiment is configured to identify matching values differing in less than a predetermined number of ternary content-addressable memory (TCAM) cells. A TCAM entry includes t TCAM entry cells, with each particular TCAM entry cell of said TCAM entry cells being configured to identify whether or not a bit value of a lookup word in a bit position in the lookup word corresponding to said particular TCAM cell matches the particular TCAM entry cell's predetermined value of a set of values including: one, zero and don't care. A match line, coupled to each of said TCAM entry cells, is configured to provide a match reference voltage after the match line is precharged during a precharge phase prior to a matching phase of a lookup operation on the lookup word. The match line is responsive to said identifications of not matching by said TCAM cells, such that the match reference voltage falls at rate corresponding to the number of active discharge paths in the TCAM entry cells that do not match for the lookup word. A comparator, coupled to the match line, is configured to identify whether or not the match reference voltage is above or below a predetermined voltage level selected to reflect a matching of the lookup word by at least t-u said TCAM cells at a predetermined time of the lookup operation. The predetermined voltage level is selected such that said match reference voltage will be above the predetermined voltage level at the predetermined time if u or less of said TCAM cells said identified as not matching and the match reference voltage will be below the predetermined voltage level at the predetermined time if at least u+1 said TCAM cells said identified as not matching; wherein t>u>0.

One embodiment performs error protected lookup operations on a data value in a ternary content-addressable memory (TCAM) entry. The TCAM entry includes t TCAM cells; the data value includes a plurality of data bit values from a set of data bit values including one, zero, and don't care; and at least 2u+1 copies of the data value are stored among the t TCAM cells. One embodiment includes a match line coupled to each of said t TCAM cells; means for precharging the match line coupled to the match line; means for determining whether or not each of said TCAM cells matches a bit value at a corresponding bit position in a lookup word, with each of said TCAM cells said determining that it does not match providing a discharge path for the previously precharged match line causing a match reference voltage of the match line to vary during the lookup operation at a rate reflective of the number of said TCAM cells that said determined that it does not match; and means for determining whether or not the match reference voltage reflects not matching u or less than u said TCAM cells at a predetermined time during the lookup operation thus determining whether or not the lookup word matched the TCAM entry; wherein t>u>0. In one embodiment, said means for determining whether or not the match reference voltage reflects not matching less than u said TCAM cells at a predetermined time during the lookup operation includes means for comparing the match reference voltage to a predetermined voltage level and identifying a hit if the match reference voltage is greater than the predetermined voltage level and identifying a miss if the match reference voltage is less than the predetermined voltage level.

One embodiment includes a data latching mechanism coupled to the comparator for latching said identification of whether or not the match reference voltage is above or below a predetermined voltage level at the predetermined time. One embodiment includes a predetermined voltage level mechanism for generating a static voltage level for the predetermined voltage level. One embodiment includes a predetermined voltage level mechanism for dynamically defining the predetermined voltage level corresponding to u. In one embodiment, u is at least two. In one embodiment, at least 2u+1 copies of a data word to be protected are stored among said t TCAM entry cells. One embodiment includes a storage word replicater such that at least 2u+1 copies of a received data word to be protected are stored among said t TCAM entry cells. In one embodiment, the lookup word includes 2u+1 copies of a portion of the lookup word. One embodiment provides 2u+1 copies of a portion of the lookup word to the TCAM entry in response to receiving the portion of the lookup word.

One embodiment performs error protected lookup operations on a data value in a ternary content-addressable memory (TCAM) entry. The TCAM entry includes t TCAM cells, and the data value includes a plurality of data bit values from a set of data bit values including one, zero, and don't care. At least 2u+1 copies of the data value are stored among said t TCAM cells. The lookup word is applied to said t TCAM cells. A determination is made as to whether or not at least all but u of said TCAM cells match their respective bit position in the lookup word. A hit/miss indication of whether or not at least all but u of said TCAM cells match their respective bit position in the lookup word is generated. In one embodiment, t>u>0. In one embodiment, this determination is performed using discrete logic. In one embodiment, this determination is made based on a voltage level of one or more match lines.

One embodiment performs error protected lookup operations on a data value in a ternary content-addressable memory (TCAM) entry. The TCAM entry includes t TCAM cells, and the data value includes a plurality of data bit values from a set of data bit values including one, zero, and don't care. At least 2u+1 copies of the data value are stored among said t TCAM cells, t>u>0. A match line coupled to each of said t TCAM cells is precharged in preparation for performing a lookup operation based on a lookup word. The lookup word is applied to said t TCAM cells. A determination is made as to whether or not each of said TCAM cells matches a bit value at a corresponding bit position in the lookup word, with each of said TCAM cells said determining that it does not match providing a discharge path for the match line previously said precharged match line causing a match reference voltage of the match line to vary during the lookup operation at a rate reflective of the number of said TCAM cells that said determined that it does not match. A hit/miss indication of whether or not the match reference voltage reflects not matching up to u said TCAM cells at a predetermined time during the lookup operation is provided to indicate whether or not the lookup word matched the TCAM entry.

In one embodiment, u is at least two. In one embodiment, the lookup word includes 2u+1 copies of a portion of the lookup word. In one embodiment, the match reference voltage is compared to a predetermined voltage level and a hit is identified if the match reference voltage is greater than the predetermined voltage level and a miss is identified if the match reference voltage is less than the predetermined voltage level.

Figure 2:
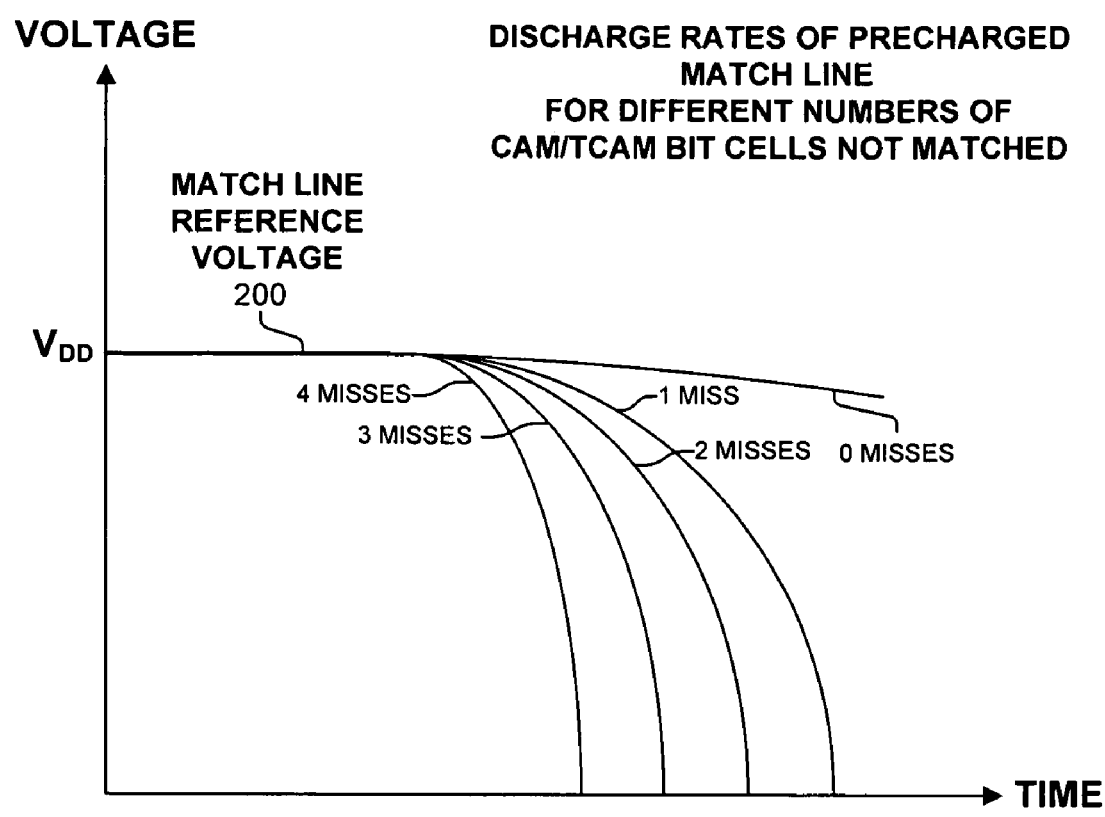
FIG. 2 illustrates an observed varying of the match reference voltage of a precharged match line of a content-addressable memory cell in response to the number of content-addressable memory bit cells not matching their respective bits of a lookup word.

FIG. 2 illustrates an observed varying of the match reference voltage 200 of a precharged match line of a binary or ternary content-addressable memory cell in response to the number of content-addressable memory bit cells not matching their respective bits of a lookup word. As shown, depending on the number of misses (i.e., the number of comparison circuits providing a discharge path in the content-addressable memory entry), the rate at which the match reference voltage 200 will drop varies.

Figure 3A:
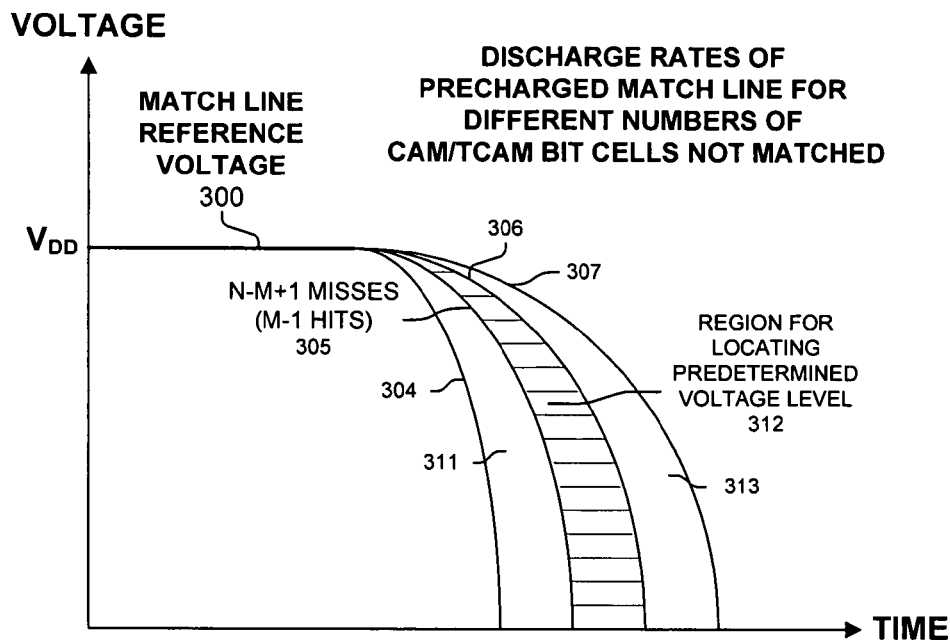
FIGS. 3A-B illustrate a mechanism for determining a predetermined voltage level and a predetermined time corresponding to the maximum number of bit positions that can be identified as not matching while still considering that the content-addressable memory entry matched for the lookup word.
Figure 3B:
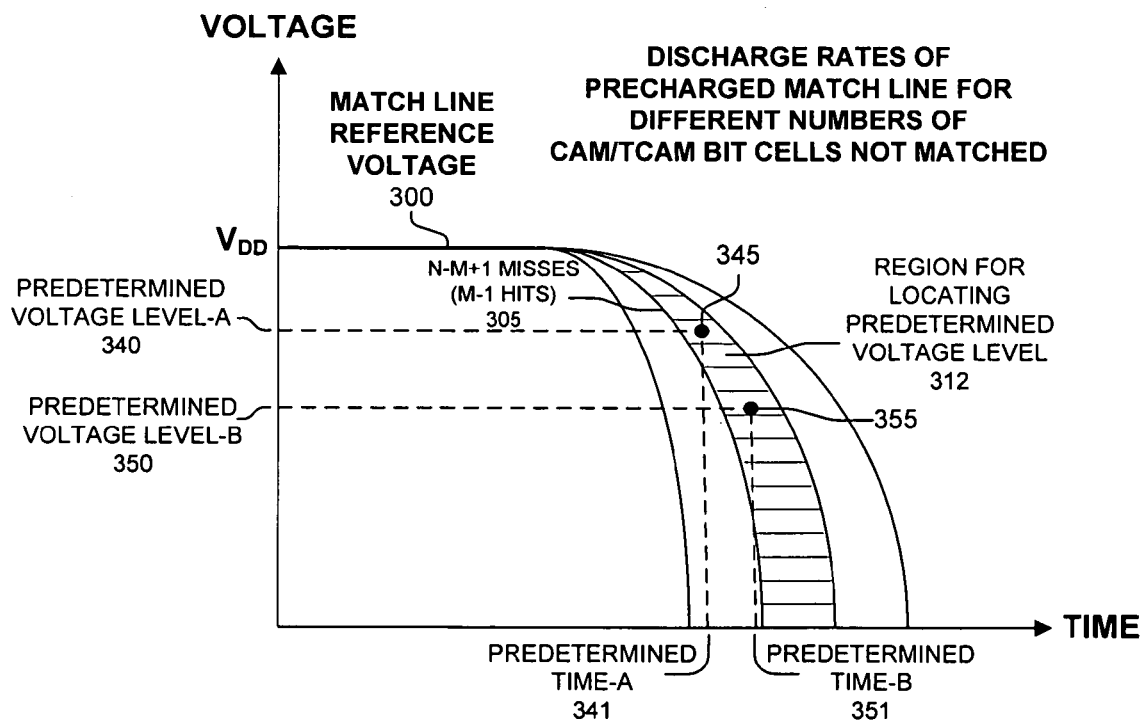

FIGS. 3A-B illustrate a mechanism for determining a predetermined voltage level and a predetermined time corresponding to the maximum number of bit positions that can be identified as not matching while still considering that the binary or ternary content-addressable memory entry matched for the lookup word. FIG. 3A illustrates (by the voltage drop curves 304-307) the varying of the match reference voltage 300 of a precharged match line of a content-addressable memory cell in response to the number of content-addressable memory bit cells not matching their respective bits of a lookup word. Each of the rate of voltage drop curves 304-307 correspond to varying numbers of content-addressable memory bit cells not matching their respective bits of a lookup word, with regions (311, 312, 313) being defined by these voltage drop curves 304-307. Of course, the actual discharge rate of a match line is dependent on the implementation of the embodiment, and therefore, the selection of the predetermined voltage level and predetermined time for sampling the match reference voltage level on the match line will need to be selected accordingly. A convenient mechanism for selecting these values is to simulate the circuitry of the implementation using a design tool (e.g., Spice) to plot the change in the match reference voltage on the match line for varying numbers of discharge paths produced in result of non-matching bit positions in a content-addressable memory entry.

Of particular interest in FIG. 3A is voltage drop curve 305, which corresponds to n−m+1 of the content-addressable memory entry bit cells identifying as not matching their corresponding bit of the lookup word, and drop curve 306, which corresponds to n−m of the content-addressable memory entry bit cells identifying as not matching their corresponding bit of the lookup word. Voltage drop curves 305 and 306 define region 312, wherein the intersection of the predetermined voltage level and predetermined time of the lookup operation should lie for comparing the match reference voltage of the match line to the predetermined voltage level for determining whether or not the content-addressable memory entry should be identified as matched for the lookup word.

This is further illustrated in FIG. 3B, which illustrates two possible intersection points 345 and 355, which could be used in an embodiment, as could other points within region 312. Typically, the intersection point is chosen for speed reasons (e.g., to have a shorter predetermined time for sampling the match line reference voltage) as well as to provide a margin for error within the tolerances of the actual devices used to implement the embodiment. As shown, intersection point 345 corresponds to predetermined voltage level-A 340 and predetermined time-A 341, and intersection point 355 corresponds to predetermined voltage level-B 350 and predetermined time-B 351.

Figure 4A:
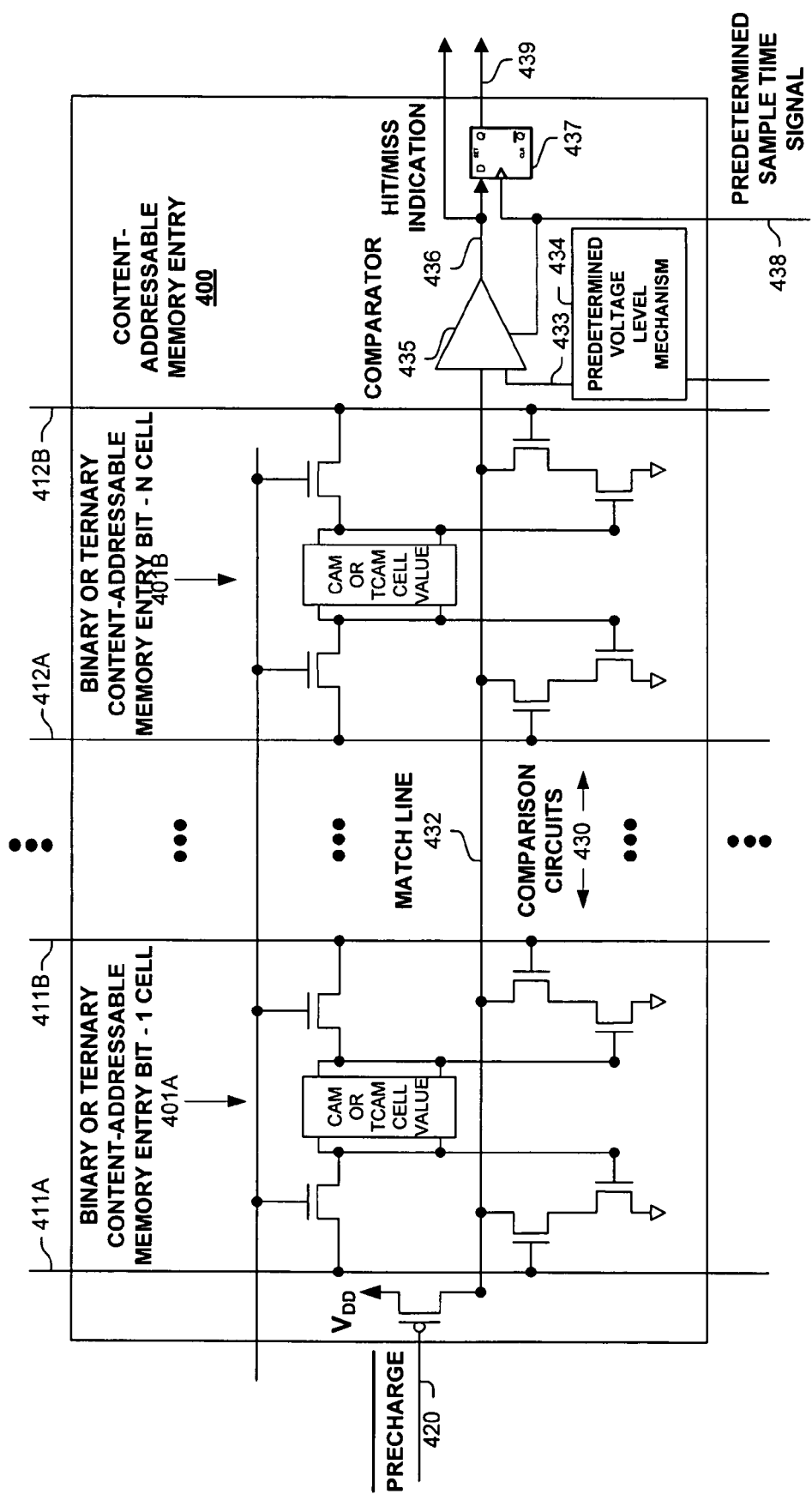
FIG. 4A is a block diagram of a content-addressable memory entry of a content-addressable memory according to one embodiment.

FIG. 4A is a block diagram of a binary or ternary content-addressable memory entry 400 of a content-addressable memory according to one embodiment. As shown, content-addressable memory entry 400 includes multiple CAM/TCAM cells including, but not limited to, CAM/TCAM cells 401A-B. Each cell 401A-B typically includes a storage for storing a value (e.g., one, zero, don't care) to be matched against (although in one embodiment, these values are stored elsewhere). In order to determine if content-addressable memory entry 400 matches a lookup word, match line 432 is precharged to Vdd based on precharging signal 420 during a precharging phase of the lookup operation. The encode bit values (e.g., typically the value and its complement for a CAM or the encoded value or complement thereof for a TCAM) of the lookup word are applied on bit lines 411A-B and 412A-B, which are compared by comparison circuits 430 during a matching phase of the lookup operation to the bit values of bit cells 401A-B. For a ternary content-addressable memory, the comparison operation is effectively disabled if the bit cell is programmed with a don't care—as it matches any value of the corresponding bit of the lookup word. If any of the entry bit cells 401A-B determine that they do not match, then match line 432 is discharged by the corresponding comparison circuit(s) 430 at a rate reflective of the number of entry bit cells 401A-B identifying that their value does not match their respective bit of the lookup word (such as, but not limited to that illustrated in FIGS. 2, 3A, and 3B), with each of these non-matching bit cells providing a discharge path for precharged match line 432.

Comparator 435 compares the match reference voltage on match line 432 to predetermined voltage level 433 at the predetermined sample time 438 (with these predetermined values selected to provide proper results, such as selected in a manner disclosed herein). In one embodiment, predetermined voltage level mechanism 434 generates a static predetermined voltage level 433. In one embodiment, a voltage level is received from an external source, and predetermined voltage level mechanism 434 relays, possibly after adjusting the received voltage level, to comparator 435 as predetermined voltage level 433. In one embodiment, predetermined voltage level 433 is selected from among different voltage levels corresponding to different values of m, and predetermined voltage level mechanism 434 includes mechanisms for selecting among different voltage levels and/or for producing different voltage levels. For example, in one embodiment, a value reflective of m is received by predetermined voltage level mechanism 434, which correspondingly defines (e.g., selects, produces, generates, etc.) predetermined voltage level 433 provided to comparator 435.

Comparators are well-known in the art, with a good reference being Phillip E. Allen and Douglas R. Holberg, CMOS Analog Circuit Design, Oxford University Press (Second Ed.), 2002, Chapter 8. In one embodiment comparator 435 is responsive to predetermined sample time signal 438 to produce hit/miss indication 436 based on the comparison at the predetermined time (as indicated by signal 438). In one embodiment, comparator 435 continuously compares the match reference voltage on match line 432 to predetermined voltage level 433 to continuously generate hit/miss indication 436, while latching mechanism 437 is responsive to latch the value of hit miss indication 436 at predetermined sample time 438 (e.g., exactly at the time or shortly thereafter to allow for settling of the results of the comparison and/or a propagation delay), and to generate hit/miss indication 439 reflective of the comparison between the match reference voltage on match line 432 and predetermined voltage level 433 at the predetermined time (as indicated by signal 438).

Figure 4B:
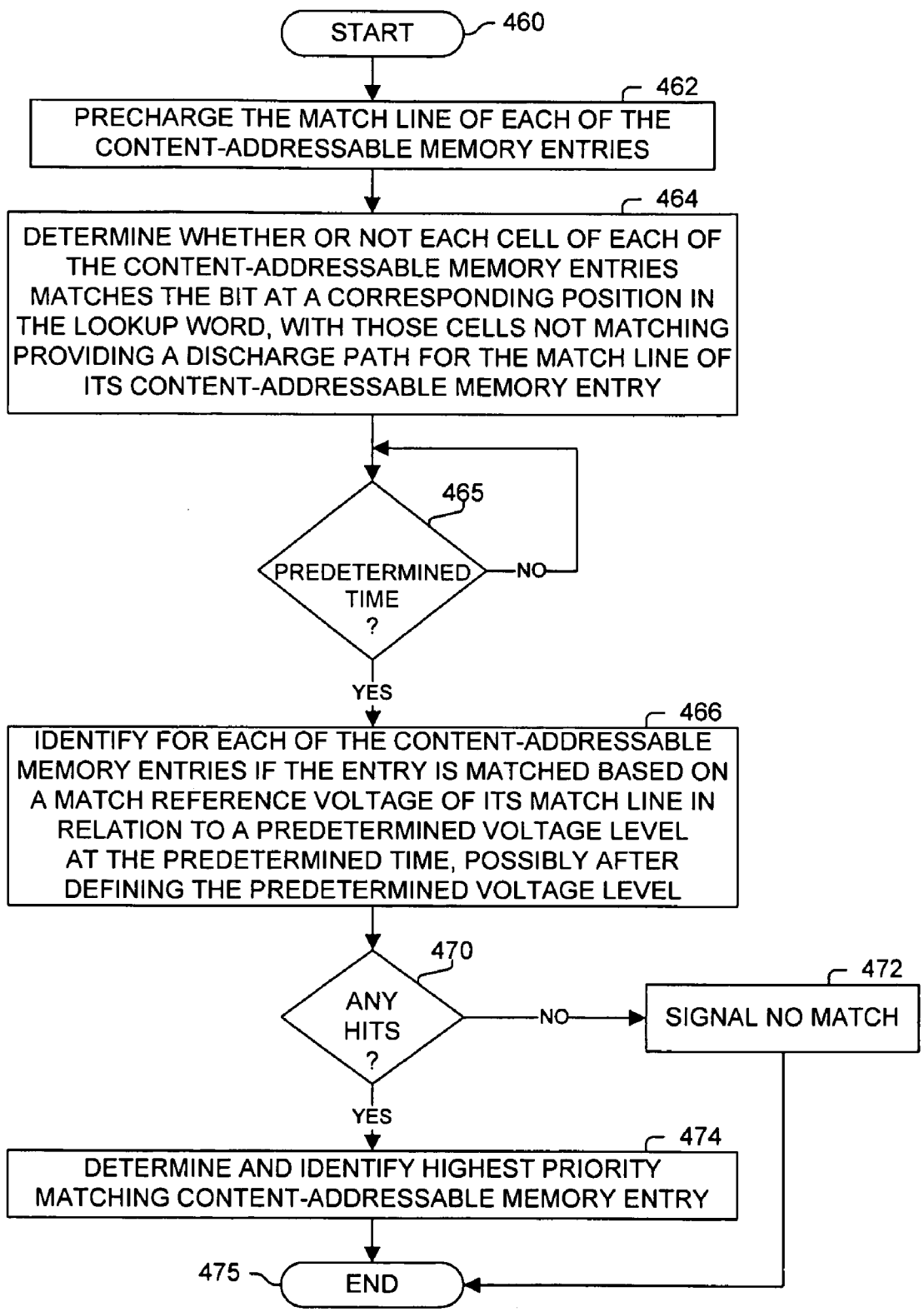
FIG. 4B is a flow diagram of a process used in one embodiment for identifying whether or not a content-addressable memory cell should be considered as matching.

FIG. 4B illustrates a process used in one embodiment. Processing begins with process block 460, and proceeds to process block 462, wherein the match line of each of the binary or ternary content-addressable memory entries is precharged. In process block 464, each bit cell of each content-addressable memory entry (or at least the enabled bit cells not having a don't care bit value) identifies whether or not it matches its corresponding bit in a lookup word, and if it does not match, it provides a discharge path for the match reference voltage of the precharged match line. As determined in process block 465, when the predetermined time arrives, then in process block 466, a comparison is made between the current value of the match reference voltage of the match line and the predetermined voltage level to identify whether or not the entry should be identified as being matched. In one embodiment, the match reference voltage is a static voltage level. In one embodiment in process block 466, the predetermined voltage level is defined (e.g., selected, produced, generated, etc.) corresponding to the desired value of m. As determined in process block 470, if any of the content-addressable entries are identified as being matched, then in process block 474, the highest priority one of the matching content-addressable entries is identified; otherwise, a no-match indication is identified in process block 472. Processing is complete as indicated by process block 475.

Figure 5:
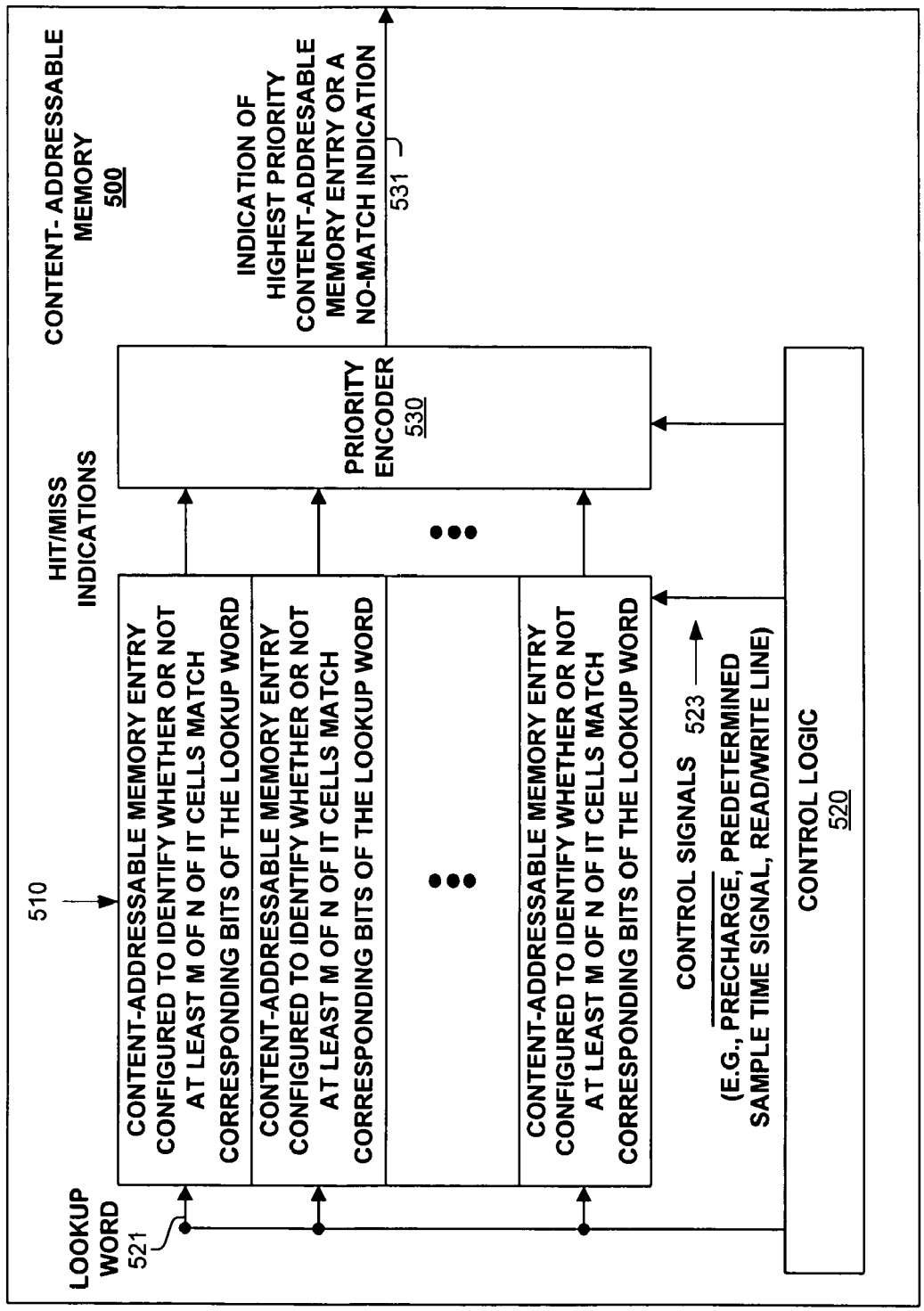
FIG. 5 is a block diagram of a content-addressable memory used in one embodiment.

FIG. 5 is a block diagram of a binary or ternary content-addressable memory 500 used in one embodiment. As shown, content-addressable memory 500 includes multiple content-addressable memory entries 510, each of which is configured as disclosed herein (of course, or an equivalent thereof) to identify whether or not the entry should be considered to have matched lookup word 521 even if less than all bit positions match. Control logic 520 provides control signal 523 (e.g., precharge, predetermined sample time, read/write line, etc.) to content-addressable memory entries 510 and to priority encoder 530 to control the timing and lookup operations. Priority encoder 530 typically identifies the highest priority one of content-addressable memory entries 510 which are identified as matching lookup word 521 or a no-hit indication for the current lookup operation to produce indication 531.

Figure 6:
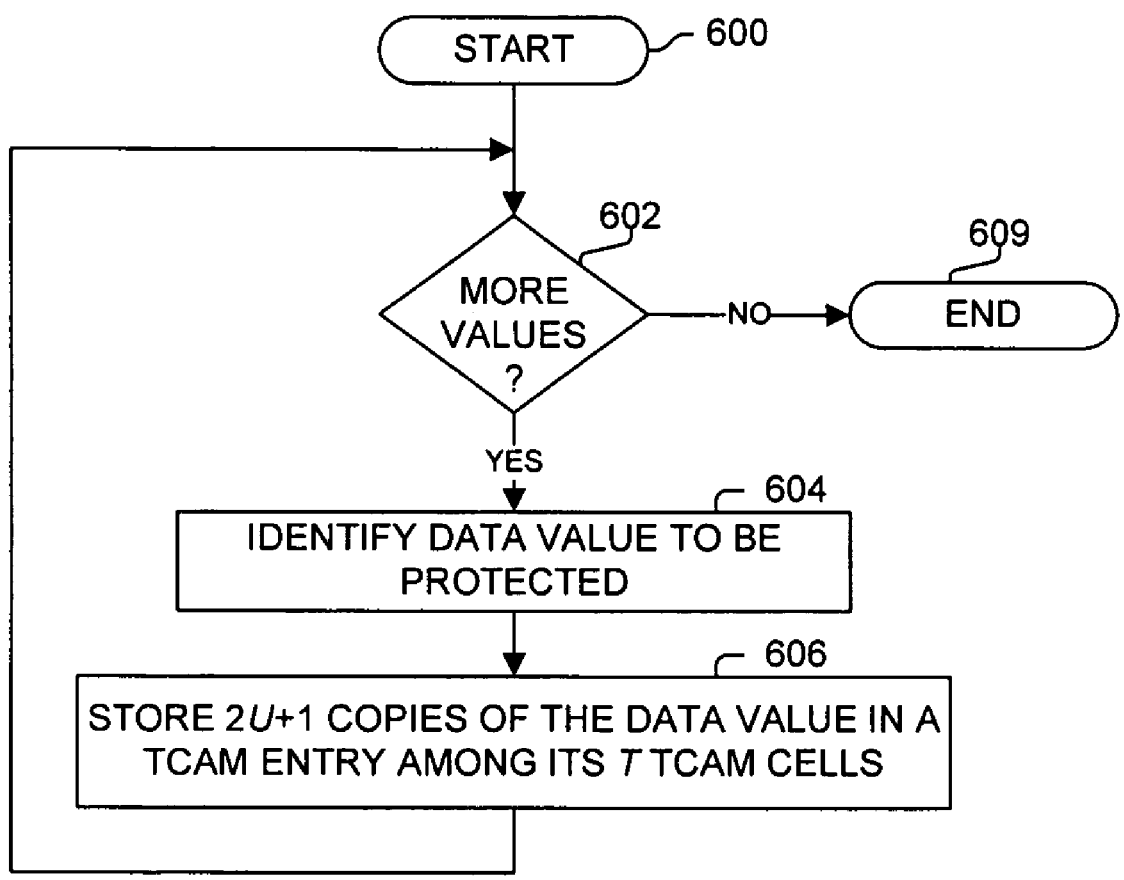
FIG. 6 is a flow diagram of a process used in one embodiment for programming TCAM entries.

FIG. 6 is a flow diagram of a process used in one embodiment for programming TCAM entries. In one embodiment, each TCAM entry includes t TCAM cells. Conventional TCAMs store a data value, which includes a plurality of data bit values from a set of data bit values including one, zero, and don't care. By storing only the data value, no error protection is available. In other words, these conventional TCAMs are designed with a value of u of zero (i.e., all cells of an entry must match in order for a TCAM entry to be considered as matching).

In contrast, one embodiment, not only stores the original data value, but stores an additional 2u copies of the data value to provide a margin wherein up to u TCAM entry cells can have errors, yet only true hits with no false hits or false misses will be detected. Note, the phrase "copies of the data value" refers to values being exactly the same, or some deterministic value derived there from (e.g., a one being mapped to a zero, and vice versa).

Therefore, in one embodiment, a TCAM entry is programmed with exactly, or at least 2u+1 copies of the data value stored among said t TCAM cells, wherein u refers to the maximum number of non-matching TCAM cells that will be allowed while still considering the TCAM entry to be matching. The number of protection bits required for protecting TCAM cells is typically larger than that required for binary CAM cells because of the implications of the don't care value, which can be programmed in or result from a bit error in the TCAM cell. Also, the don't care value allows the matching of different lookup words by multiple different TCAM entries. By storing an additional 2u copies of each bit of a data value in a TCAM entry, error free protection of up to u bit errors is provide. Therefore, in order to provide one bit of error protection (i.e., u=1) for a data value of length twenty-four, a TCAM entry will require at least three (2u+1) times twenty-four or seventy-two TCAM entry cells. Note, these seventy-two TCAM entry cells can be in any order, as long as the 2u+1 (i.e., seventy-two bits in this example) bits of the lookup word are applied in the same ordering. One embodiment automatically generates the 2u copies of the received lookup word and correspondingly applies them to the TCAM entry cells. The (2u+1-sized) lookup word is applied to the t TCAM cells. A determination is made as to whether or not at least all but u of said TCAM cells match their respective bit position in the lookup word. A hit/miss indication of whether or not at least all but u of said TCAM cells match their respective bit position in the lookup word is generated. In one embodiment, t>u>0. In one embodiment, this determination is performed using discrete logic. In one embodiment, this determination is made based on a voltage level of one or more match lines.

FIG. 6 is a flow diagram of a process used in one embodiment for programming TCAM entries. Processing beings with process block 600. As determined in process block 602, while there are more data values to store: the next data value is identified (604), and the 2u+1 copies of the data value are stored in the TCAM entry among its t TCAM cells (606). When all data values have been programmed, processing is complete as indicated by process block 609.

In view of the many possible embodiments to which the principles of our invention may be applied, it will be appreciated that the embodiments and aspects thereof described herein with respect to the drawings/figures are only illustrative and should not be taken as limiting the scope of the invention. For example and as would be apparent to one skilled in the art, many of the process block operations can be re-ordered to be performed before, after, or substantially concurrent with other operations. Also, many different forms of data structures could be used in various embodiments. The invention as described herein contemplates all such embodiments as may come within the scope of the following claims and equivalents thereof.

What is claimed is:

1. An apparatus configured to identify matching values differing in less than a predetermined number of ternary content-addressable memory (TCAM) cells, the apparatus comprising:

a TCAM entry including t TCAM entry cells, each particular TCAM entry cell of said TCAM entry cells being configured to identify whether or not a bit value of a lookup word in a bit position in the lookup word corresponding to said particular TCAM cell matches the particular TCAM entry cell's predetermined value of a set of values including: one, zero and don't care;

a match line, coupled to each of said TCAM entry cells, configured to provide a match reference voltage after the match line is precharged during a precharge phase prior to a matching phase of a lookup operation on the lookup word; wherein the match line is responsive to said identifications of not matching by said TCAM cells, wherein said match reference voltage falls at rate corresponding to the number of active discharge paths in said TCAM entry cells said identifying not matching for the lookup word; and a comparator, coupled to the match line, configured to identify whether or not the match reference voltage is above or below a predetermined voltage level selected to reflect a matching of the lookup word by at least t-u said TCAM cells at a predetermined time of the lookup operation, wherein the predetermined voltage level is selected such that said match reference voltage will be above the predetermined voltage level at the predetermined time if u or less of said TCAM cells said identified as not matching and the match reference voltage will be below the predetermined voltage level at the predetermined time if at least u+1 said TCAM cells said identified as not matching; wherein $t>u>0$.

2. The apparatus of claim 1, comprising a data latching mechanism coupled to the comparator for latching said identification of whether or not the match reference voltage is above or below a predetermined voltage level at the predetermined time.

3. The apparatus of claim 1, including a predetermined voltage level mechanism for generating a static voltage level for the predetermined voltage level.

4. The apparatus of claim 1, including a predetermined voltage level mechanism for dynamically defining the predetermined voltage level corresponding to u.

5. The apparatus of claim 4, wherein u is at least two.

6. The apparatus of claim 1, wherein at least 2u+1 copies of a data word to be protected are stored among said t TCAM entry cells.

7. The apparatus of claim 1, wherein u is at least two.

8. A method for performing error protected lookup operations on a data value in a ternary content-addressable memory (TCAM) entry, the TCAM entry including t TCAM cells, the data value including a plurality of data bit values from a set of data bit values including one, zero, and don't care, the method comprising:

storing at least 2u+1 copies of the data value among said t TCAM cells;

precharging a match line coupled to each of said t TCAM cells in preparation for performing a lookup operation based on a lookup word;

applying the lookup word to said t TCAM cells;

determining whether or not each of said TCAM cells matches a bit value at a corresponding bit position in the lookup word, with each of said TCAM cells said determining that it does not match providing a discharge path for the match line previously said precharged match line causing a match reference voltage of the match line to vary during the lookup operation at a rate reflective of the number of said TCAM cells that said determined that it does not match; and providing a hit/miss indication of whether or not the match reference voltage reflects not matching up to u said TCAM cells at a predetermined time during the lookup operation thus indicating whether or not the lookup word matched the TCAM entry; wherein $t>u>0$.

9. The method of claim 8, wherein u is at least two.

10. The method of claim 8, wherein the lookup word includes 2u+1 copies of a portion of the lookup word.

11. The method of claim 8, including comparing the match reference voltage to a predetermined voltage level and identifying a hit if the match reference voltage is greater than the predetermined voltage level and identifying a miss if the match reference voltage is less than the predetermined voltage level.

12. A method for performing error protected lookup operations on a data value in a ternary content-addressable memory (TCAM) entry, the TCAM entry including t TCAM cells, the data value including a plurality of data bit values from a set of data bit values including one, zero, and don't care, the method comprising:

storing at least 2u+1 copies of the data value among said t TCAM cells;

applying the lookup word to said t TCAM cells;

determining whether or not at least all but u of said TCAM cells match their respective bit position in the lookup word; and providing a hit/miss indication of whether or not at least all but u of said TCAM cells match their respective bit position in the lookup word; wherein $t>u>0$.

13. The method of claim 12, wherein u is at least two.

14. The method of claim 12, wherein the lookup word includes 2u+1 copies of a portion of the lookup word.

15. An apparatus for performing error protected lookup operations on a data value in a ternary content-addressable memory (TCAM) entry, the TCAM entry including t TCAM cells, with the data value including a plurality of data bit values from a set of data bit values including one, zero, and don't care, and with at least 2u+1 copies of the data value stored among said t TCAM cells, the apparatus comprising:

a match line coupled to each of said t TCAM cells;

means for precharging the match line coupled to the match line;

means for determining whether or not each of said TCAM cells matches a bit value at a corresponding bit position in a lookup word, with each of said TCAM cells said determining that it does not match providing a discharge path for the previously precharged match line causing a match reference voltage of the match line to vary during the lookup operation at a rate reflective of the number of said TCAM cells that said determined that it does not match; and means for determining whether or not the match reference voltage reflects not matching less than u said TCAM cells at a predetermined time during the lookup operation thus determining whether or not the lookup word matched the TCAM entry; wherein $t>u>0$.

16. The apparatus of claim 15, wherein u is at least two.

17. The apparatus of claim 15, wherein the lookup word includes 2u+1 copies of a portion of the lookup word.

18. The apparatus of claim 17, wherein u is at least two.

19. The apparatus of claim 15, wherein said means for determining whether or not the match reference voltage reflects not matching less than u said TCAM cells at a predetermined time during the lookup operation includes means for comparing the match reference voltage to a predetermined voltage level and identifying a hit if the match reference voltage is greater than the predetermined voltage level and identifying a miss if the match reference voltage is less than the predetermined voltage level.

20. The apparatus of claim 19, wherein u is at least two.

* * * * *